US012765434B2

(12) United States Patent
Saito

(10) Patent No.: US 12,765,434 B2
(45) Date of Patent: Oct. 13, 2026

(54) SEMICONDUCTOR DEVICE

(71) Applicant: FUJI ELECTRIC CO., LTD., Kawasaki (JP)

(72) Inventor: Takashi Saito, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 377 days.

(21) Appl. No.: 18/341,157

(22) Filed: Jun. 26, 2023

(65) Prior Publication Data

US 2023/0335527 A1 Oct. 19, 2023

Related U.S. Application Data

(63) Continuation of application No. PCT/JP2022/019854, filed on May 10, 2022.

(30) Foreign Application Priority Data

Jul. 16, 2021 (JP) ................................ 2021-118039

(51) Int. Cl.
*H10W 90/00* (2026.01)
*H10W 70/685* (2026.01)
(Continued)

(52) U.S. Cl.
CPC ....... *H10W 90/701* (2026.01); *H10W 70/685* (2026.01); *H10W 74/111* (2026.01);
(Continued)

(58) Field of Classification Search
CPC .............. H01L 2224/83203; H01L 2924/3512
See application file for complete search history.

(56) References Cited

U.S. PATENT DOCUMENTS 9,324,684 B2 * 4/2016 Hino .................. H10W 72/073
9,627,342 B2 4/2017 Saito et al.
(Continued)

FOREIGN PATENT DOCUMENTS

CN 108475647 A 8/2018
EP 2 960 930 A1 12/2015
(Continued)

OTHER PUBLICATIONS

International Search Report issued in International Application No. PCT/JP2022/019854 dated Jul. 19, 2022.
(Continued)

*Primary Examiner* — Dale E Page
*Assistant Examiner* — Rohit Parthasarathy

(57) ABSTRACT

Provided is a semiconductor device including a bonding layer made from sintered material and having a configuration capable of avoiding a variation in life span. The semiconductor device includes a conductive plate having a main surface, a semiconductor chip deposited to be opposed to the main surface of the conductive plate, and a bonding layer including porous sintered material and arranged between the conductive plate and the semiconductor chip, wherein a first outer edge of a bonding interface between the bonding layer and the conductive plate is located on the inside of an outer circumference of the semiconductor chip and is located on the inside of a second outer edge of a bonding interface between the bonding layer and the semiconductor chip.

15 Claims, 19 Drawing Sheets

(51) Int. Cl.
*H10W 72/00* (2026.01)
*H10W 74/10* (2026.01)

(52) U.S. Cl.
CPC .... *H10W 72/07332* (2026.01); *H10W 72/884* (2026.01); *H10W 90/736* (2026.01); *H10W 90/756* (2026.01)

(56) References Cited

U.S. PATENT DOCUMENTS

| | | | | |
|---|---|---|---|---|
| 10,403,559 | B2 | 9/2019 | Fuku et al. | |
| 10,535,628 | B2 * | 1/2020 | Khaselev | B22F 1/05 |
| 10,727,150 | B2 * | 7/2020 | Murakami | H10W 40/22 |
| 10,727,167 | B2 | 7/2020 | Yamada et al. | |
| 11,239,196 | B2 * | 2/2022 | Shiraki | H10W 40/255 |
| 11,342,281 | B2 | 5/2022 | Yabuta et al. | |
| 12,030,125 | B2 * | 7/2024 | Anai | B22F 7/064 |
| 12,247,270 | B2 * | 3/2025 | Akai | H01R 11/01 |
| 2008/0156398 | A1 * | 7/2008 | Yasuda | B23K 35/34<br>148/23 |
| 2008/0160183 | A1 * | 7/2008 | Ide | H01B 1/02<br>252/500 |
| 2008/0173398 | A1 * | 7/2008 | Yasuda | H05K 3/321<br>156/326 |
| 2009/0244868 | A1 * | 10/2009 | Morita | H10W 72/20<br>174/257 |
| 2010/0195292 | A1 * | 8/2010 | Ide | H05K 3/32<br>174/257 |
| 2014/0001636 | A1 * | 1/2014 | Saito | C23C 18/1651<br>438/610 |
| 2014/0264383 | A1 * | 9/2014 | Kajiwara | H10W 72/50<br>257/77 |
| 2014/0374775 | A1 * | 12/2014 | Saito | H10W 72/073<br>257/77 |
| 2015/0130085 | A1 * | 5/2015 | Hino | H10W 72/073<br>257/782 |
| 2018/0096919 | A1 * | 4/2018 | Roth | H10W 70/435 |
| 2018/0190611 | A1 * | 7/2018 | Tatsumi | H10W 40/255 |
| 2018/0197833 | A1 * | 7/2018 | Sakakibara | H10W 70/20 |
| 2019/0006265 | A1 * | 1/2019 | Yamada | H10D 12/411 |
| 2019/0074236 | A1 * | 3/2019 | Fuku | H10W 40/255 |
| 2020/0043834 | A1 * | 2/2020 | Shiraki | H10W 40/255 |
| 2020/0251423 | A1 * | 8/2020 | Yabuta | H10W 42/121 |
| 2021/0020456 | A1 * | 1/2021 | Oohiraki | H10W 70/098 |
| 2022/0045027 | A1 * | 2/2022 | Ochi | H10W 72/073 |
| 2022/0254738 | A1 | 8/2022 | Yabuta et al. | |
| 2023/0142695 | A1 * | 5/2023 | Hinata | H10W 74/114<br>257/783 |
| 2023/0335527 | A1 * | 10/2023 | Saito | H10W 72/073 |
| 2023/0369276 | A1 * | 11/2023 | Saito | H10W 72/30 |
| 2025/0226276 | A1 * | 7/2025 | Saito | H10W 74/121 |

FOREIGN PATENT DOCUMENTS

| | | | |
|---|---|---|---|
| JP | 2012-009703 | A | 1/2012 |
| JP | 2015-095540 | A | 5/2015 |
| JP | 2015-153966 | A | 8/2015 |
| JP | 2015-177182 | A | 10/2015 |
| JP | 2015-216160 | A | 12/2015 |
| JP | 2016-213288 | A | 12/2016 |
| JP | 2017-071826 | A | 4/2017 |
| JP | 6399906 | B2 | 10/2018 |
| JP | 2021-027116 | A | 2/2021 |
| WO | 2012/121355 | A1 | 9/2012 |
| WO | 2014/129626 | A1 | 8/2014 |
| WO | 2017/203650 | A1 | 11/2017 |
| WO | 2019/087920 | A1 | 5/2019 |

OTHER PUBLICATIONS

Written Opinion issued in International Application No. PCT/JP2022/019854 dated Jul. 19, 2022.

Chinese Office Action dated Jul. 31, 2026 for the corresponding Chinese Patent Application No. 202280008843.9.

* cited by examiner

SEMICONDUCTOR DEVICE

CROSS-REFERENCE TO RELATED APPLICATION

This application is a Continuation of PCT Application No. PCT/JP2022/019854, filed on May 10, 2022, and claims the priority of Japanese Patent Application No. 2021-118039, filed on Jul. 16, 2021, the content of which are incorporated herein by reference.

TECHNICAL FIELD

The present invention relates to a semiconductor device (a semiconductor module) equipped with power semiconductor chips.

BACKGROUND ART

Power semiconductor chips (hereinafter, referred to simply as "semiconductor chips) are typically used as switching elements for power conversion. A semiconductor module equipped with such a power semiconductor chip has a structure in which the semiconductor chip is bonded onto an insulated circuit substrate via a bonding layer made from solder. Research and development of bonding technology that uses sintered material including metal particles such as silver (Ag) for bonding layers have grown in recent years in order to achieve high heat resistance, high heat-releasing performance, and high reliability.

JP 2015-153966 A, JP 2015-95540 A and WO 2012/121355 A1 each disclose a sintered-material layer having bonding interfaces with a conductive plate and a semiconductor chip, in which an outer circumference of the respective bonding interfaces is located on the inside of the outer circumference of the semiconductor chip in a plan view. JP 2015-216160 A discloses a power semiconductor device configured to include a metallic sintered body having a lower porosity at a position close to a lateral side of a power semiconductor element than at a position close to the middle of the power semiconductor element. WO 2014/129626 A1 discloses a connection structure in which a ratio of a porosity of an intermediate portion in the thickness direction of an outer peripheral side part of a region further towards the outside than a cross-section part formed at a position of a distance equivalent to the thickness of the porous metal layer from the side surface of the porous metal layer toward the inside, to the porosity of a center side after having excluded the outer peripheral side part, falls within a range of 1.10 to 1.60.

JP 2015-177182 A discloses a power module including a part corresponding to a circumferential edge of a semiconductor element having a structure bonded via bonding material with a low Young's modulus and a middle part having a structure bonded via sintered-metal bonding material, in which the material at the circumferential edge is substantially the same as the sintered-metal bonding material used in the middle part of the semiconductor element, but includes metal material having a smaller density than that used in the middle part of the semiconductor element. JP 2012-9703 A discloses a structure including a first sintered pattern, a second sintered pattern, and third metallic particle paste, in which the second sintered pattern, the third metallic particle paste, and the first sintered pattern are arranged in this order between a substrate and a semiconductor element, and are heated to be bonded together.

U.S. Pat. No. 10,535,628 B2 discloses a method of printing sintered paste onto a substrate or on a bottom surface of a die. JP 6399906 B2 discloses a bonding layer including a first bonding layer provided on the inside of an edge of a semiconductor element, and a second bonding layer provided on the inside of the edge of the semiconductor element and on the outside of the first bonding layer, in which the second bonding layer is made from sintered-metal bonding material having a smaller particle diameter than that used in the first bonding layer.

SUMMARY OF THE INVENTION

Technical Problem

The conventional semiconductor modules as described above using the bonding layer that is made from solder is damaged because of deterioration of the bonding layer in association with an increase in heat resistance, and thus have a short but stable life span.

While the bonding layer made from sintered material used for the semiconductor modules has the characteristics having relatively high resistance to deterioration, the semiconductor modules using such a boding layer tend to be damaged suddenly because other parts deteriorate earlier than the bonding layer. The semiconductor modules using the bonding layer made from the sintered material thus have a longer life span than the semiconductor modules using the bonding layer made from solder, but have a problem with a variation in the life span.

In view of the foregoing problems, the present invention provides a semiconductor device including a bonding layer made from sintered material with a configuration capable of avoiding a variation in life span.

Solution to Problem

An aspect of the present invention inheres in a semiconductor device including: a conductive plate having a main surface; a semiconductor chip deposited to be opposed to the main surface of the conductive plate; and a bonding layer including porous sintered material and arranged between the conductive plate and the semiconductor chip, wherein a first outer edge of a bonding interface between the bonding layer and the conductive plate is located on an inside of an outer circumference of the semiconductor chip and is located on an inside of a second outer edge of a bonding interface between the bonding layer and the semiconductor chip.

DETAILED DESCRIPTION

Figure 1:
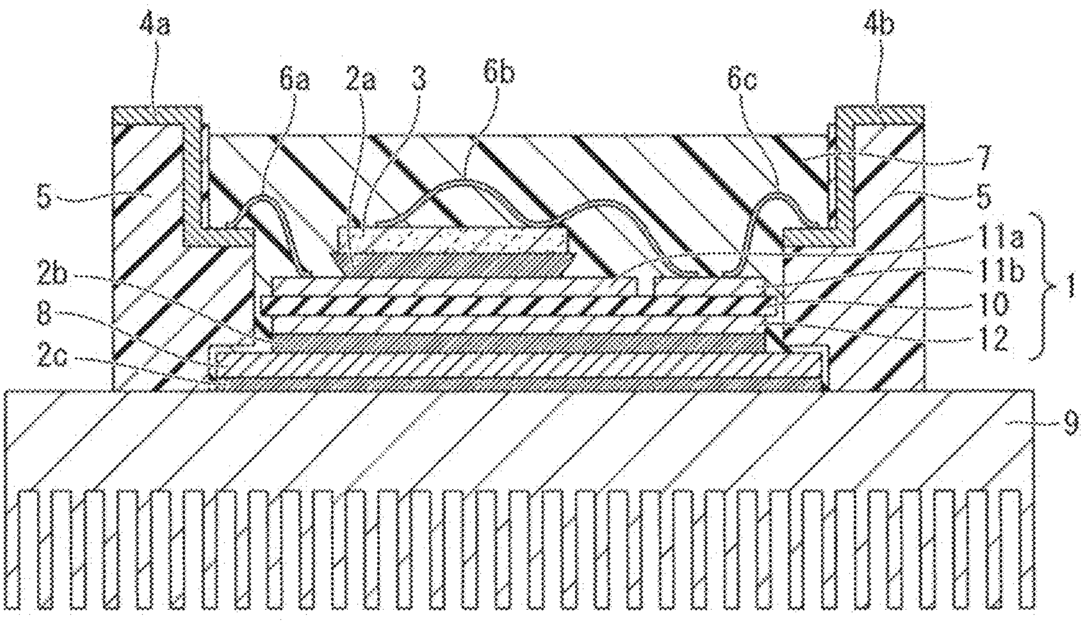
FIG. 1 is a cross-sectional view illustrating a semiconductor device according to a first embodiment.

With reference to the drawings, first to fourth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Moreover, in some drawings, portions are illustrated with different dimensional relationships and proportions. The first to fourth embodiments described below merely illustrate schematically devices and methods for specifying and giving shapes to the technical idea of the present invention, and the span of the technical idea is not limited to materials, shapes, structures, and relative positions of elements described herein.

Additionally, definitions of directions such as upper and lower in the following description are simply definitions for convenience of description, and do not limit the technological concept of the present invention. For example, when observing an object rotated by 90 degrees, the upper and lower are converted to left and right to be read, and when observing an object rotated by 180 degrees, the upper and lower are read reversed, which should go without saying.

First Embodiment

As illustrated in FIG. 1, a semiconductor device (a semiconductor module) according to a first embodiment includes an insulated circuit substrate 1, a semiconductor chip 3 deposited to be opposed to the main surface (the top surface) of the insulated circuit substrate 1, and a bonding layer 2*a* including porous sintered material and arranged between the insulated circuit substrate 1 and the semiconductor chip 3.

The insulated circuit substrate 1 may be a direct copper bonded (DCB) substrate or an active metal brazed (AMB) substrate, for example. The insulated circuit substrate 1 includes an insulating plate 10, conductive plates (circuit plates) 11*a* and 11*b* deposited on the top surface of the insulating plate 10, and a conductive plate (a heat-releasing plate) 12 deposited on the bottom surface of the insulating plate 10. The insulating plate 10 is a ceramic substrate made from aluminum oxide ($Al_2O_3$), aluminum nitride (AlN), or silicon nitride ($Si_3N_4$), or a resin insulating substrate including polymer material, for example. The conductive plates 11*a* and 11*b* and the conductive plate 12 are each conductor foil of metal such as copper (Cu) and aluminum (Al), for example.

The sintered material included in the bonding layer 2*a* as used herein can be metallic particle paste (conductive paste) in which metal particles such as gold (Au), silver (Ag), or copper (Cu) are dispersed in an organic component so as to be in a paste state, or bonding material in a sheet state containing metal particles, and is obtained by sintering of these kinds of material. The metal particles have a fine particle diameter of about several nanometers to several micrometers. The use of the silver (Ag)-based sintered material, which can be bonded at a low temperature and led to have the same fusing point as Ag after the bonding, can provide a bonding layer having high heat resistance and high reliability with no necessity of increasing the temperature.

The semiconductor chip 3 is deposited to be opposed to the main surface (the top surface) of the conductive plate 11*a*. The semiconductor chip 3 to be used can be an insulated gate bipolar transistor (IGBT), a field-effect transistor (FET), a static induction (SI) thyristor, a gate turn-off (GTO) thyristor, or a freewheeling diode (FWD), for example. The semiconductor chip 3 may be a silicon (Si) substrate, or may be a compound semiconductor substrate of a wide-bandgap semiconductor made from silicon carbide (SiC), gallium nitride (GaN), or gallium oxide ($Ga_2O_3$), for example. A bottom-surface electrode made from gold (Au) or the like in the semiconductor chip 3 is bonded to the conductive plate 11*a* via the bonding layer 2*a*. While FIG. 1 illustrates the case of including the single semiconductor chip 3, the number of the semiconductor chips can be determined as appropriate depending on a current capacity of the semiconductor module, for example, and the semiconductor module may include two or more semiconductor chips.

A case 5 made from insulating material such as resin is provided to cover the outer circumference of the insulated circuit substrate 1 and the semiconductor chip 3. The case 5 is filled with a sealing member 7 for sealing the bonding layer 2*a* and the semiconductor chip 3. The sealing member 7 as used herein can be made from insulating material such as silicone gel or thermosetting resin, for example. External terminals 4*a* and 4*b* are fixed to the case 5. The semiconductor chip 3, the conductive plates 11*a* and 11*b*, and the external terminals 4*a* and 4*b* are electrically connected to each other via bonding wires 6*a*, 6*b*, and 6*c*.

A heat-releasing base 8 made from metal such as copper (Cu) is provided on the bottom surface side of the insulated circuit substrate 1 via a bonding layer 2*b*. A heat-releasing fin 9 made from metal such as copper (Cu) is provided on the bottom surface side of the heat-releasing base 8 via a bonding layer 2*c*. The bonding layers 2*b* and 2*c* as used herein can be made from sintered material, solder, or thermal interface material (TIM), for example. The respective bonding layers 2*b* and 2*c* may be made from the same material as the bonding layer 2*a*, or may be made from material different from that of the bonding layer 2*a*.

Figure 2:
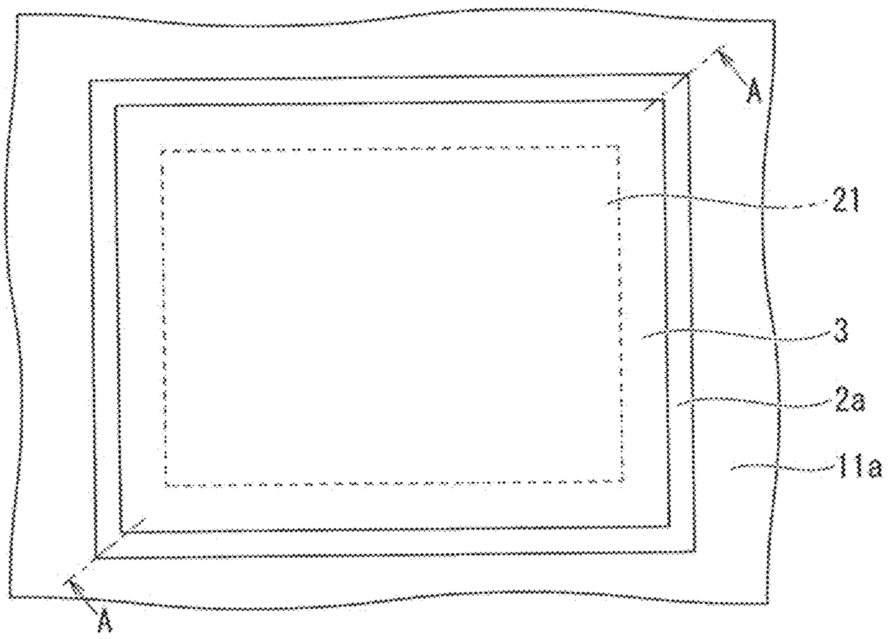
FIG. 2 is a plan view illustrating the semiconductor device according to the first embodiment.

FIG. 2 is a plan view illustrating the conductive plate 11*a* of the insulated circuit substrate 1 and the semiconductor chip 3 illustrated in FIG. 1. As illustrated in FIG. 2, the semiconductor chip 3 has a rectangular planar pattern. The semiconductor chip 3 has a size of about 5 millimeters×5 millimeters, for example, but is not limited to this size. The bonding layer 2*a* has a rectangular planar pattern. The outer edge of the bonding layer 2*a* on the top surface side (toward the semiconductor chip 3) is located on the outside of the outer circumference of the semiconductor chip 3. The outer edge of the bonding layer 2*a* on the top surface side (toward the semiconductor chip 3) may conform to the outer circumference of the semiconductor chip 3, or may be located on the inside of the outer circumference of the semiconductor chip 3.

Figure 3:
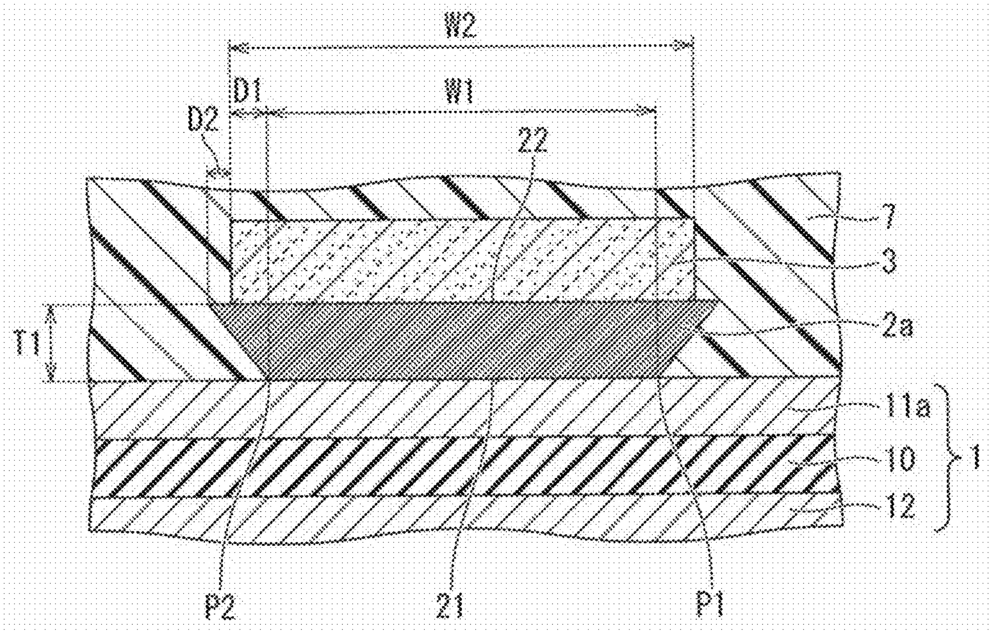
FIG. 3 is a cross-sectional view as viewed from direction A-A in FIG. 2.

FIG. 3 is a cross-sectional view taken along the diagonal line of the semiconductor chip 3 as viewed from direction A-A in FIG. 2. As illustrated in FIG. 3, the bonding layer 2*a* has a substantially trapezoidal shape (a tapered shape) in cross section having a longer length at the upper base on the top surface side (toward the semiconductor chip 3) than at the lower base on the bottom surface side (toward the conductive plate 1*a*). While FIG. 3 illustrates the case in which the respective side surfaces of the bonding layer 2*a* are flat surfaces, the side surfaces of the bonding layer 2*a* may be convex either to the outside or to the inside. For example, the respective surfaces of the bonding layer 2*a* toward the conductive plate 11*a* may be convex toward the conductive plate 11*a* on the outside of the outer edge of a bonding interface 21 between the bonding layer 2*a* and the conductive plate 11*a*. The outer edge of the bonding interface 21 between the bonding layer 2*a* and the conductive plate 11*a* has a point at which three of the bonding layer 2*a*, the conductive plate 11*a*, and the sealing member 7 overlap with each other. A width W1 of the bonding interface 21 between the bonding layer 2*a* and the conductive plate 11*a* is narrower than a width W2 of a bonding interface 22 between the bonding layer 2*a* and the semiconductor chip 3. The outer edge of the bonding interface 22 between the bonding layer 2*a* and the semiconductor chip 3 conforms to the outer circumference of the semiconductor chip 3. FIG. 2 schematically indicates the bonding interface 21 between the bonding layer 2*a* and the conductive plate 11 by the broken line.

As illustrated in FIG. 1 to FIG. 3, the outer edge of the bonding interface 21 between the bonding layer 2*a* and the conductive plate 11*a* is located on the inside of the outer circumference of the semiconductor chip 3 and is located on the inside of the outer edge of the bonding interface 22 between the bonding layer 2*a* and the semiconductor chip 3. This configuration provides stress-concentrated portions P1 and P2 at the outer edge of the bonding interface 21 between the bonding layer 2*a* and the conductive plate 11*a*. The stress-concentrated portions P1 and P2 typically cause cracks that tend to gradually proceed toward the middle of the bonding layer 2*a* to increase thermal resistance, causing damage to the semiconductor device. The stress-concentrated portions P1 and P2 correspond to the positions at the outer edge of the bonding interface 21 between the bonding layer 2*a* and the conductive plate 11*a* (indicated by the broken line) illustrated in the planar pattern in FIG. 2, and tend to easily cause cracks particularly starting from the four corners of the rectangular pattern defined by the bonding interface 21.

Namely, the semiconductor device according to the first embodiment, which has the configuration in which the outer edge of the bonding interface 21 between the bonding layer 2*a* and the conductive plate 11*a* is located on the inside of the outer circumference of the semiconductor chip 3 and is located on the inside of the outer edge of the bonding interface 22 between the bonding layer 2*a* and the semiconductor chip 3, provides the stress-concentrated portions P1 and P2 at the outer edge of the bonding interface 21 so as to positively cause cracks starting from the stress-concentrated portions P1 and P2. This configuration enables the rate limiting of the life span in the bonding layer 2*a* to intentionally lead to damage to the semiconductor device, so as to avoid a variation in the life span of semiconductor devices to be manufactured.

A distance D1 between the outer edge of the bonding interface 21 between the bonding layer 2*a* and the conductive plate 11*a* and the outer edge of the bonding interface 22 between the bonding layer 2*a* and the semiconductor chip 3 is in a range of about 5 micrometers or greater and 50 micrometers or less, for example, but is not limited to this range. A thickness T1 of the bonding layer 2*a* is in a range of about 10 micrometers or greater and 50 micrometers or less for example, but is not limited to this range. The distance D1 is about 1/2500 or greater and 1/50 or less of the length of the diagonal line of the semiconductor chip 3 in the planar pattern, and is about 1/1250 or greater and 1/50 or less of the thickness T1 of the bonding layer 2*a*, but is not limited to this case and can be adjusted as appropriate depending on the type of the bonding layer 2*a*, the thickness T1 of the bonding layer 2*a*, and the size of the semiconductor chip 3, for example.

The stress concentrated on the stress-concentrated portions P1 and P2 increases as the outer edge of the bonding interface 21 between the bonding layer 2*a* and the conductive plate 11*a* is located further on the inside of the semiconductor chip 3 so as to increase the distance D1, and cracks starting from the stress-concentrated portions P1 and P2 thus tend to be caused more easily. The adjustment of the distance D1 therefore can regulate the cause of cracks starting from the stress-concentrated portions P1 and P2, and can control the life span of the semiconductor device accordingly.

The outer edge of the bonding layer 2*a* on the top surface side (toward the semiconductor chip 3) projects to the outside by a distance D2 from the outer circumference of the semiconductor chip 3. The distance D2 is in a range of about 1 micrometer or greater and 30 micrometers or less, but is not limited to this range. The part of the bonding layer 2*a* projecting to the outside from the outer circumference of the semiconductor chip 3 is not necessarily provided. For example, the part of the bonding layer 2*a* projecting to the outside from the outer circumference of the semiconductor chip 3 may be removed by air blowing or washing, for example, after the execution of sintering of the bonding layer 2*a*. In such a case, the outer edge of the bonding layer 2*a* on the top surface side (toward the semiconductor chip 3) may conform to the outer circumference of the semiconductor chip 3, or may be located on the inside of the outer circumference of the semiconductor chip 3.

The sintered material included in the bonding layer 2*a* is porous and has pores (holes) between the metal particles. A porosity between the metal particles in a region of the bonding layer 2*a* located on the inside of the outer edge of the bonding interface 21 between the bonding layer 2*a* and the conductive plate 11*a* is higher than a porosity between the metal particles in a region of the bonding layer 2*a* located on the inside of the outer edge of the bonding interface 22 between the bonding layer 2*a* and the semiconductor chip 3 and located on the outside of the outer edge of the bonding interface 21 between the bonding layer 2*a* and the conductive plate 11*a*. The part of the bonding layer 2*a* located on the inside of the outer edge of the bonding interface 21 between the bonding layer 2*a* and the conductive plate Ila tends to cause cracks more easily than the part of the bonding layer 2*a* located on the inside of the outer edge of the bonding interface 22 between the bonding layer 2*a* and the semiconductor chip 3 and located on the outer side of the outer edge of the bonding interface 21 between the bonding layer 2*a* and the conductive plate 11*a*, and the cracks caused tend to easily advance, so as to promote destruction of the semiconductor device accordingly.

Comparative Example

Figure 4:
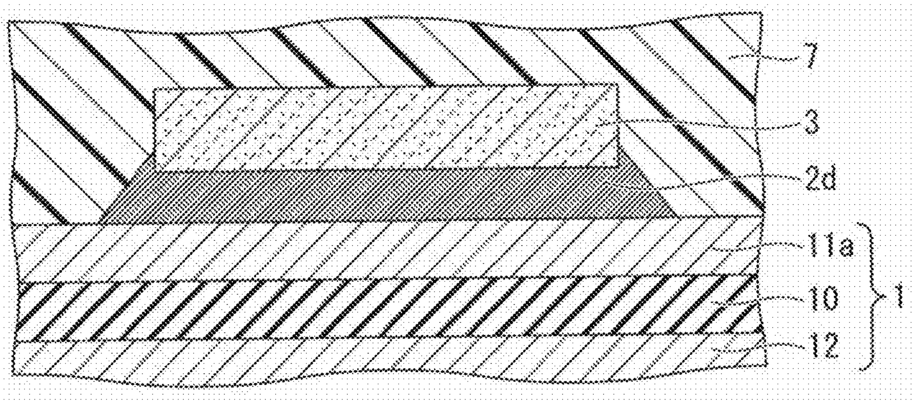
FIG. 4 is a cross-sectional view illustrating a semiconductor device of a comparative example.

A semiconductor device of a comparative example is described below. As illustrated in FIG. 4, the semiconductor device of the comparative example differs from the semiconductor device according to the first embodiment illustrated in FIG. 3 in that the outer circumference of a bonding layer 2*d* made from sintered material on the bottom surface side (toward the conductive plate 11*a*) is located on the outside of the outer circumference of the semiconductor chip 3, and the bonding layer 2*d* is in contact with the lower parts of the side surfaces of the semiconductor chip 3 so as to have side surfaces widened toward the bottom.

The semiconductor device of the comparative example including the bonding layer 2*d* made from the sintered material has a longer life span than the case of including the bonding layer made from solder. However, the bonding layer 2*d*, which has high heat resistance and high reliability, cannot serve as a member contributing to the rate limiting of the life span, and the semiconductor device thus may be suddenly damaged because of breakage of the member such as the semiconductor chip 3 and the insulated circuit substrate 1 other than the bonding layer 2*d*. This leads the semiconductor device of the comparative example to cause a variation in the life span, which could further lead to serious malfunction. In view of this, a preferable malfunction mode is a state in which the semiconductor device is damaged due to a gradual promotion of deterioration (cracks) in the bonding layer and due to an increase in thermal resistance, for example, as in the case of the bonding layer made from solder.

In contrast, the semiconductor device according to the first embodiment, which has the configuration in which the outer edge of the bonding interface 21 between the bonding layer 2*a* and the conductive plate 11*a* is located on the inside of the outer circumference of the semiconductor chip 3 and is located on the inside of the outer edge of the bonding interface 22 between the bonding layer 2*a* and the semiconductor chip 3, can positively cause cracks starting from the stress-concentrated portions P1 and P2 of the bonding layer 2*a*, so as to enable the rate limiting of the life span in the bonding layer 2*a*. This configuration leads the semiconductor device according to the first embodiment to have a shorter life span than the semiconductor device of the comparative example, but can avoid a variation in the life span of the semiconductor device and allow a relatively long life span as compared with the case of the bonding layer made from solder.

Further, since the width W2 of the bonding interface 22 between the bonding layer 2*a* and the semiconductor chip 3 is greater than the width W1 between the respective outer edges of the bonding interface 21 between the bonding layer 2*a* and the conductive plate 11*a*, the heat transmitted from the semiconductor chip 3 can be efficiently released, and the damage to the end parts of the semiconductor chip 3 thus can be avoided.

EXAMPLE

Figure 5:
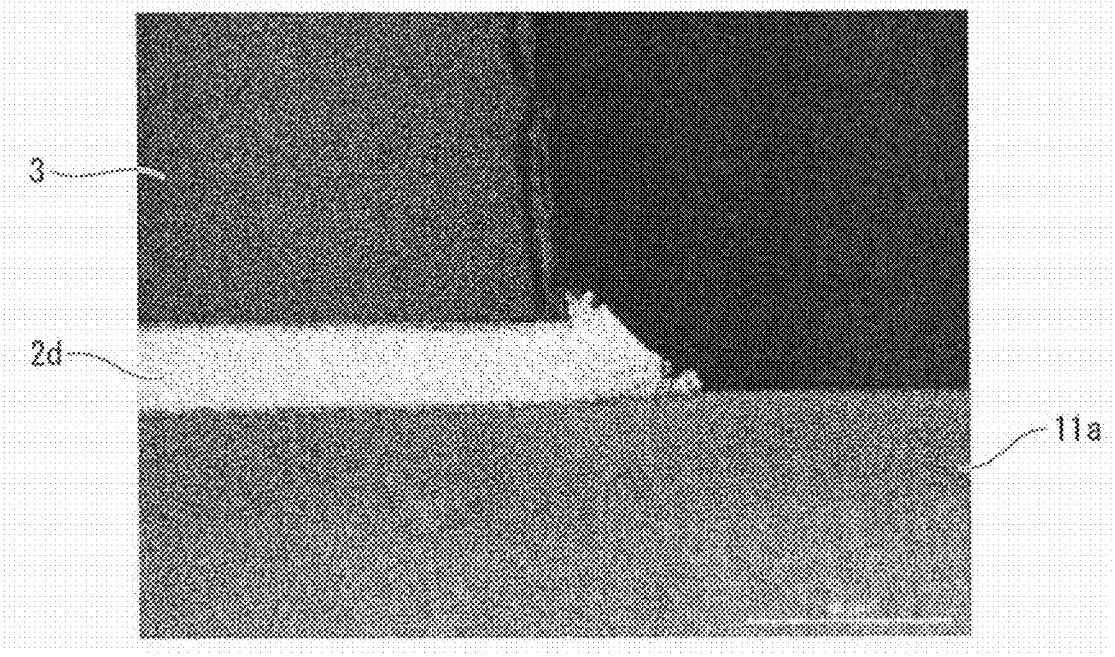
FIG. 5 is a cross-sectional image of the semiconductor device of the comparative example at an early stage.
Figure 6:
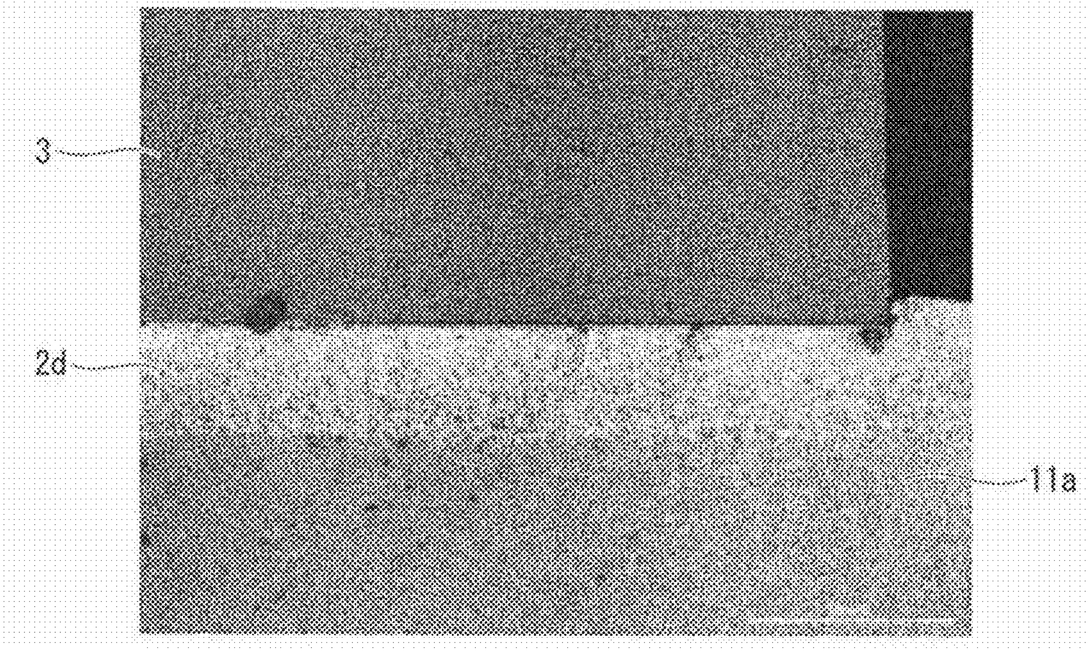
FIG. 6 is a cross-sectional image of the semiconductor device of the comparative example after an execution of a test for reliability.

The semiconductor device according to the first embodiment as illustrated in FIG. 3 and the semiconductor device of the comparative example as illustrated in FIG. 4 were manufactured so as to be subjected to a power cycle test. FIG. 5 is a cross-sectional image of the semiconductor device of the comparative example before the execution of the power cycle test, and FIG. 6 is a cross-sectional image of the semiconductor device of the comparative example after the execution of the power cycle test. As shown in FIG. 6, any deterioration (cracks) was not confirmed in the bonding layer 2*d* of the semiconductor device of the comparative example after the power cycle test, but the semiconductor device was damaged because of a deterioration in other parts excluding the bonding layer 2*d.*

Figure 7:
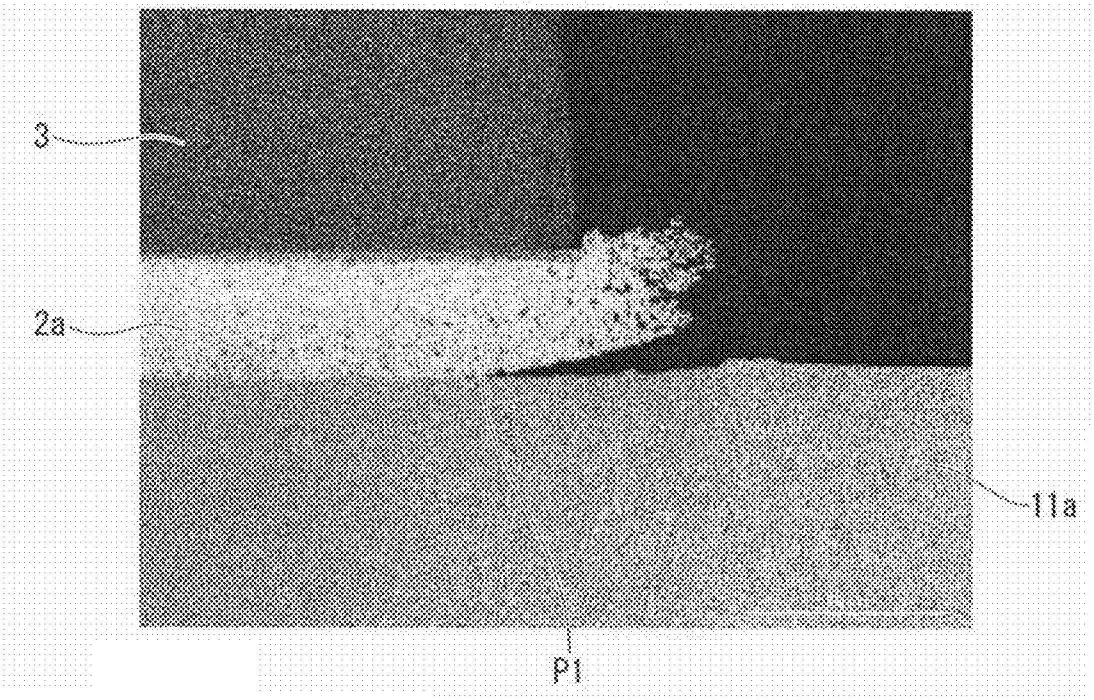
FIG. 7 is a cross-sectional image of the semiconductor device according to the first embodiment at an early stage.
Figure 8:
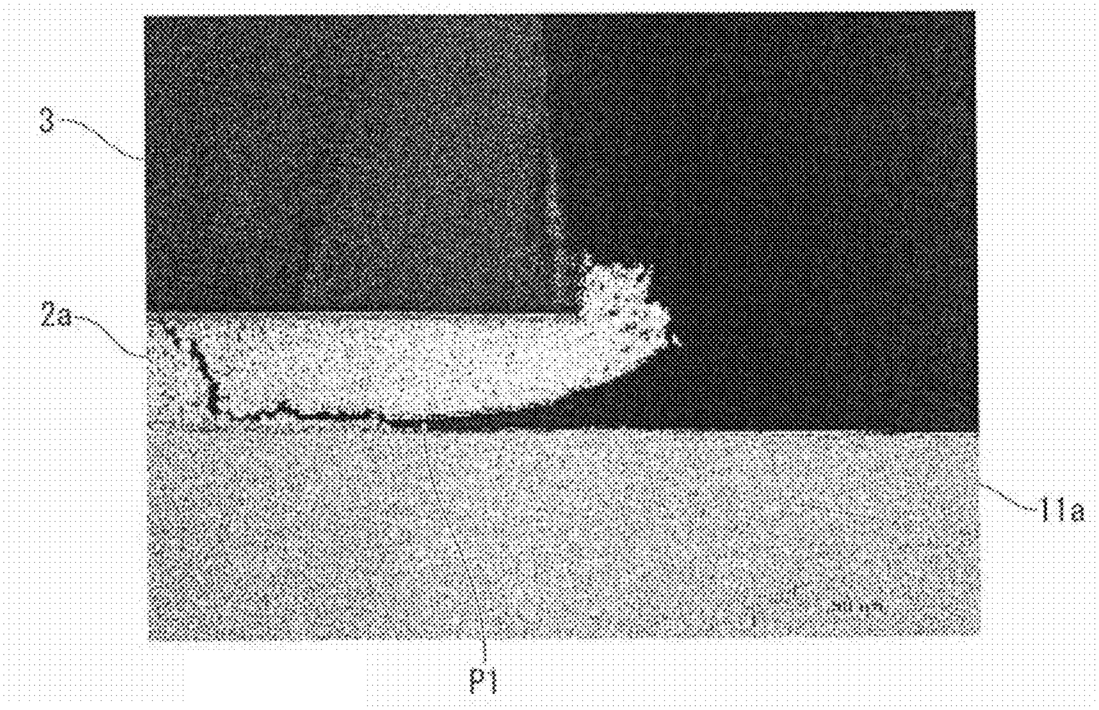
FIG. 8 is a cross-sectional image of the semiconductor device according to the first embodiment after an execution of a test for reliability.

FIG. 7 is a cross-sectional image of the semiconductor device according to the first embodiment before the execution of the power cycle test, and FIG. 8 is a cross-sectional image of the semiconductor device according to the first embodiment after the execution of the power cycle test. As shown in FIG. 8, cracks were caused at the stress-concentrated portion P1 of the bonding layer 2*a* of the semiconductor device according to the first embodiment after the execution of the power cycle test, and the cracks gradually proceeded toward the center of the bonding layer 2*a*, which damaged the semiconductor device in association with an increase in thermal resistance.

<Method of Manufacturing Semiconductor Device>

Figure 9:
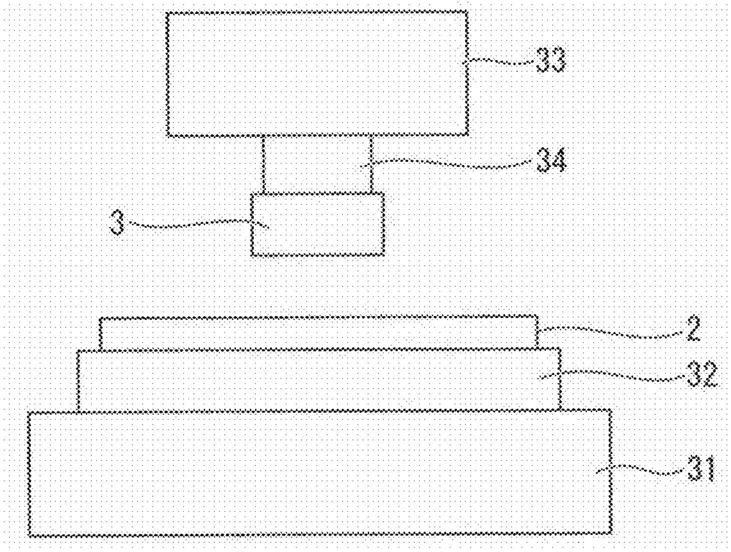
FIG. 9 is a schematic view illustrating a method of manufacturing the semiconductor device according to the first embodiment.

A method of manufacturing (assembling) the semiconductor device according to the first embodiment is described below with reference to FIG. 9 to FIG. 12. First, as illustrated in FIG. 9, a rubber sheet 32 is placed on the top surface of a base 31, and a sintered sheet 2 that is a sheet-like sintered material is further placed on the top surface of the rubber sheet 32. The semiconductor chip 3 is then led to be stuck to a sticking part 34 of a mounter head 33 so that the bottom surface of the semiconductor chip 3 is opposed to the top surface of the sintered sheet 2.

Figure 10:
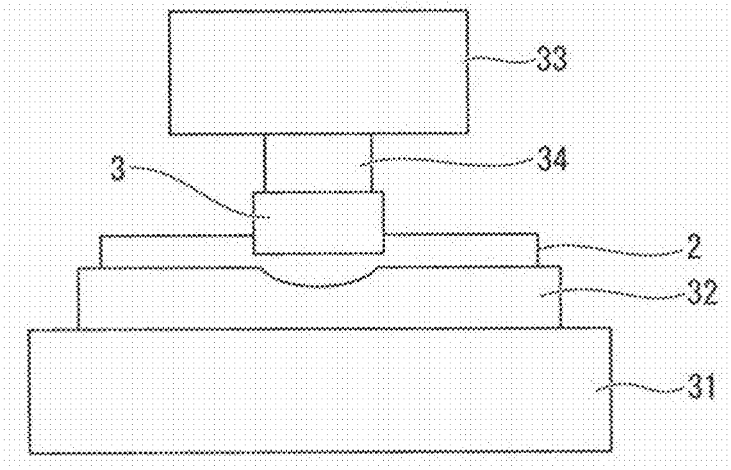
FIG. 10 is a schematic view continued from FIG. 9, illustrating the method of manufacturing the semiconductor device according to the first embodiment.

Next, as illustrated in FIG. 10, the mounter head 33 is led to go down so as to push the bottom surface of the semiconductor chip 3 against the sintered sheet 2. This step causes the stress to be concentrated on the edges of the bottom surface of the semiconductor chip 3, so as to press a part of the sintered sheet 2 on the edge side of the bottom surface of the semiconductor chip 3 to decrease the thickness of the sintered sheet 2 more at the part on the edge side of the bottom surface of the semiconductor chip 3 than at the part corresponding to the middle of the bottom surface of the semiconductor chip 3. The sintered sheet 2 thus has a lower porosity in the relatively-thin part on the edge side than in the relatively-thick part in the middle. The step of pushing the bottom surface of the semiconductor chip 3 against the sintered sheet 2 may include heat treatment and pressing treatment executed simultaneously at this point so as to facilitate the step of transferring the sintered sheet 2.

Figure 11:
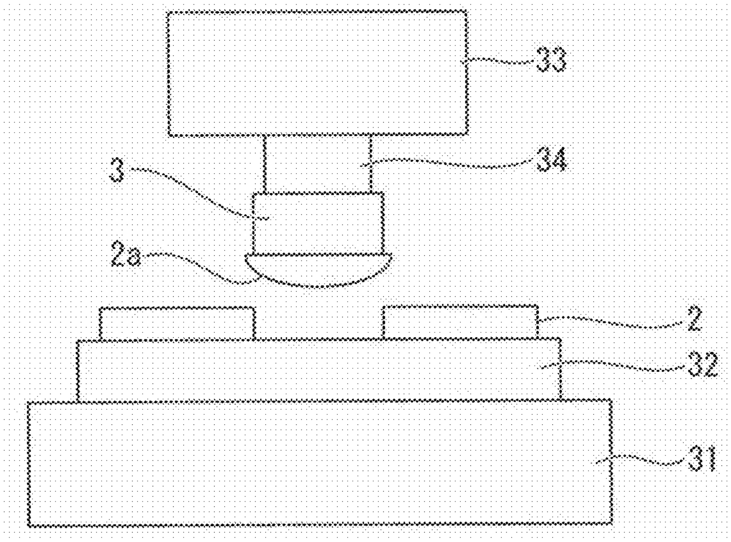
FIG. 11 is a schematic view continued from FIG. 10, illustrating the method of manufacturing the semiconductor device according to the first embodiment.

Next, as illustrated in FIG. 11, the mounter head 33 is led to be lifted up so that a part of the sintered sheet 2 is cut off and the bonding layer 2*a* as a part of the sintered sheet 2 is transferred to the bottom surface of the semiconductor chip 3. The bonding layer 2*a* has a thickness that is relatively thick in the middle and is relatively thin on the edge side.

Figure 12:
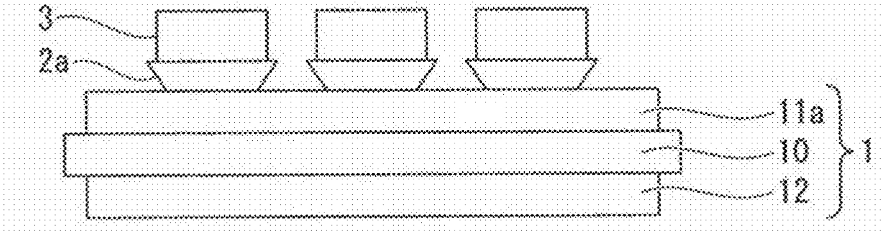
FIG. 12 is a schematic view continued from FIG. 11 illustrating the method of manufacturing the semiconductor device according to the first embodiment.

Next, the insulated circuit substrate 1 is prepared, as illustrated in FIG. 12. FIG. 12 omits the illustration of the conductive plate 11*b* of the insulated circuit substrate 1 illustrated in FIG. 1. The plural semiconductor chips 3 each equipped with the bonding layer 2*a* are mounted on the conductive plate 11*a* of the insulated circuit substrate 1 by use of a conveyer, for example. While FIG. 12 illustrates the case of including the plural semiconductor chips 3 each equipped with the bonding layer 2*a*, the present embodiment may include the single semiconductor chip 3 equipped with the bonding layer 2*a* as illustrated in FIG. 1.

Figure 13:
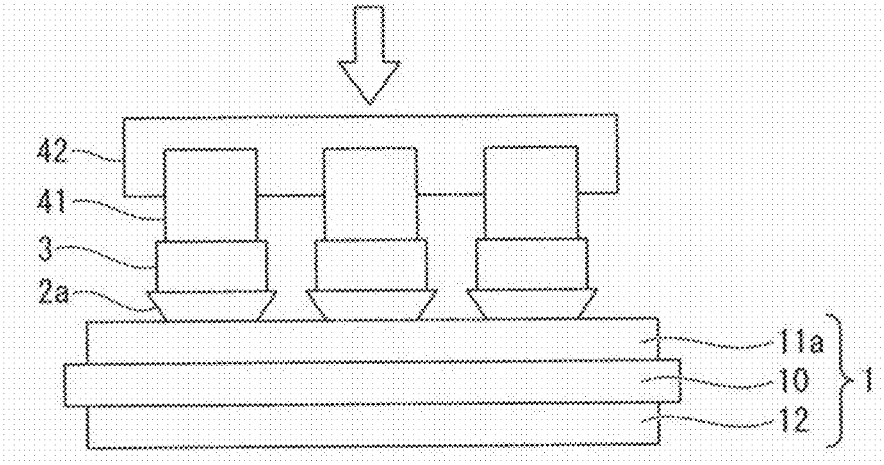
FIG. 13 is a schematic view continued from FIG. 12 illustrating the method of manufacturing the semiconductor device according to the first embodiment.

Next, as illustrated in FIG. 13, the semiconductor chips 3 are pressed from the top surface side by pressing parts 41 made from silicon (Si) rubber attached to a metal die 42 of a pressing device. The execution of the heat treatment while the semiconductor chips 3 are pressed causes a sintering reaction in the bonding layers 2*a*. This sintering reaction is caused under the conditions in which a pressing force is set to about 1 MPa or greater and 60 MPa or less, a heating temperature is set to about 150° C. or higher and 350° C. or lower, and a heating time is set to about 1 minute or longer and 5 minutes or shorter, for example. This step leads the insulated circuit substrate 1 and the respective semiconductor chips 3 to be bonded together via the bonding layers 2*a*.

Thereafter, a typical process is executed including a step of placing the case 5 on the periphery of the insulated circuit substrate 1 and the semiconductor chips 3, a step of connecting the insulated circuit substrate 1, the semiconductor chips 3, and the external terminals 4*a* and 4*b* together via the bonding wires 6*a*, 6*b*, 6*c*, and the like, and a step of sealing these members with the sealing member 7, for example, so as to complete the semiconductor device according to the first embodiment.

The method of manufacturing the semiconductor device according to the first embodiment, which uses the bonding layer 2*a* made from the sintered material, can provide the semiconductor device with a variation in the life span avoided.

While the method of manufacturing the semiconductor device according to the first embodiment is illustrated above with the case of transferring a part of the sintered sheet 2 to the bottom surface of the semiconductor chip 3, the bonding layer 2*a* in a paste state may be applied to the bottom surface of the semiconductor chip 3 by screen printing or the like so as to have a thickness thicker in the middle than on the edge side.

The method of manufacturing the semiconductor device according to the first embodiment is illustrated above with the case of mounting the rubber sheet 32 on the top surface of the base 31, but does not necessarily use the rubber sheet 32 and may provide the base 31 with recesses. The method in this case may mount the sintered sheet 2 over the recesses to push the bottom surface of the semiconductor chip 3 against the sintered sheet 2, so as to allow the transfer of the bonding layer 2*a* having a thickness thicker in the middle than on the edge side.

Second Embodiment

Figure 14:
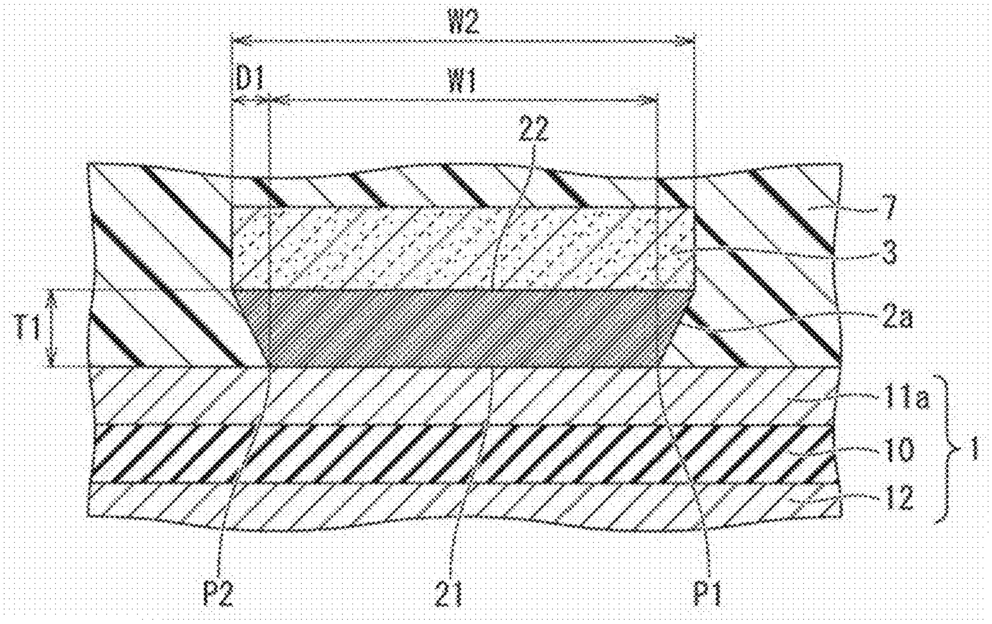
FIG. 14 is a cross-sectional view illustrating a semiconductor device according to a second embodiment.

A semiconductor device according to a second embodiment has the same configuration as the semiconductor device according to the first embodiment illustrated in FIG. 3 in that the outer edge of the bonding interface 21 between the bonding layer 2*a* and the conductive plate 11*a* is located on the inside of the outer circumference of the semiconductor chip 3 and is located on the inside of the outer edge of the bonding interface 22 between the bonding layer 2*a* and the semiconductor chip 3, as illustrated in FIG. 14. The semiconductor device according to the second embodiment differs from the semiconductor device according to the first embodiment in that the outer edge of the bonding layer 2*a* on the top surface side (toward the semiconductor chip 3) conforms to the outer circumference of the semiconductor chip 3 and conforms to the outer edge of the bonding interface 22 between the bonding layer 2*a* and the semiconductor chip 3.

The other configurations of the semiconductor device according to the second embodiment are the same as those of the semiconductor device according to the first embodiment, and overlapping explanations are not repeated below. The semiconductor device according to the second embodiment can be produced by the same process as the method of manufacturing the semiconductor device according to the first embodiment.

The semiconductor device according to the second embodiment, which is configured to positively cause cracks starting from the stress-concentrated portions P1 and P2 of the bonding layer 2*a* so as to be intentionally led to be damaged, as in the case of the configuration of the semiconductor device according to the first embodiment, can avoid a variation in the life span of the semiconductor device. Further, the configuration in which the outer edge of the bonding interface 22 between the bonding layer 2*a* and the semiconductor chip 3 conforms to the outer circumference of the semiconductor chip 3 can avoid a drop of a part of the bonding layer 2*a* as compared with the case of projecting to the outside of the outer circumference of the semiconductor chip 3.

Third Embodiment

Figure 15:
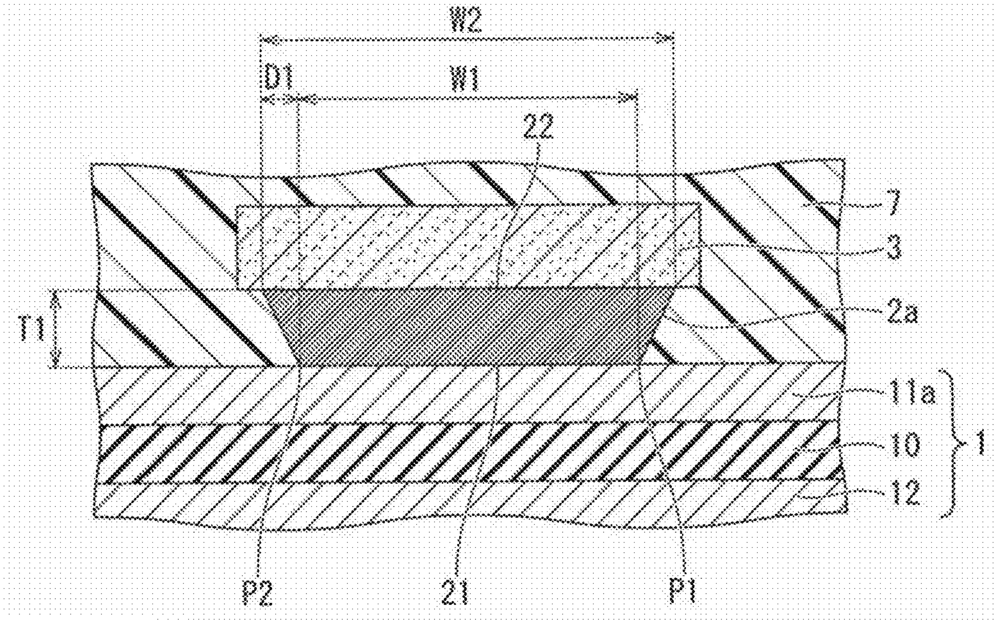
FIG. 15 is a cross-sectional view illustrating a semiconductor device according to a third embodiment.

A semiconductor device according to a third embodiment has the same configuration as the semiconductor device according to the first embodiment illustrated in FIG. 3 in that the outer edge of the bonding interface 21 between the bonding layer 2*a* and the conductive plate 11*a* is located on the inside of the outer circumference of the semiconductor chip 3 and is located on the inside of the outer edge of the bonding interface 22 between the bonding layer 2*a* and the semiconductor chip 3, as illustrated in FIG. 15. The semiconductor device according to the third embodiment differs from the semiconductor device according to the first embodiment in that the outer edge of the bonding layer 2*a* on the top surface side (toward the semiconductor chip 3) is located on the inside of the outer circumference of the semiconductor chip 3 and conforms to the outer edge of the bonding interface 22 between the bonding layer 2*a* and the semiconductor chip 3.

The other configurations of the semiconductor device according to the third embodiment are the same as those of the semiconductor device according to the first embodiment, and overlapping explanations are not repeated below. The semiconductor device according to the third embodiment can be produced by the same process as the method of manufacturing the semiconductor device according to the first embodiment.

The semiconductor device according to the third embodiment, which is configured to positively cause cracks starting from the stress-concentrated portions P1 and P2 so as to be intentionally led to be damaged, as in the case of the configuration of the semiconductor device according to the first embodiment, can avoid a variation in the life span of the semiconductor device. Further, the configuration in which the outer edge of the bonding interface 22 between the bonding layer 2*a* and the semiconductor chip 3 is located on the inside of the outer circumference of the semiconductor chip 3 can avoid a drop of a part of the bonding layer 2*a* as compared with the case of projecting to the outside of the outer circumference of the semiconductor chip 3.

Fourth Embodiment

Figure 16:
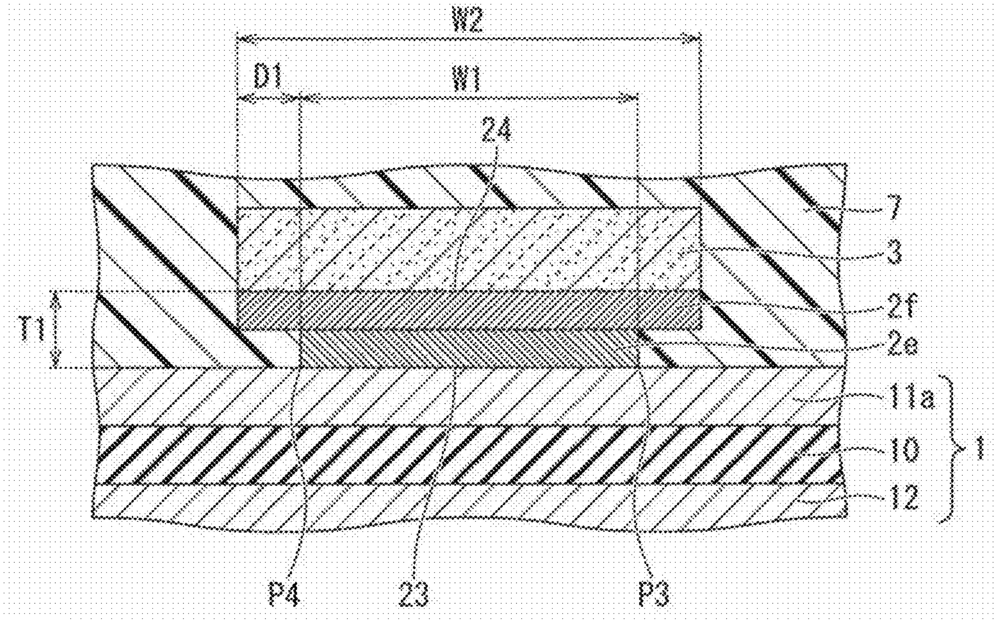
FIG. 16 is a cross-sectional view illustrating a semiconductor device according to a fourth embodiment.

A semiconductor device according to a fourth embodiment has the same configuration as the semiconductor device according to the first embodiment illustrated in FIG. 3 in that an outer edge of a bonding interface 23 between a bonding layer (2*e*, 2*f*) made from sintered material and the conductive plate 11*a* is located on the inside of the outer circumference of the semiconductor chip 3 and is located on the inside of an outer edge of a bonding interface 24 between the semiconductor chip 3 and the bonding layer (2*e*, 2*f*), as illustrated in FIG. 16. The semiconductor device according to the fourth embodiment differs from the semiconductor device according to the first embodiment in that the bonding layer (2*e*, 2*f*) has a two-layer structure including a first bonding layer (a lower-side bonding layer) 2*e* bonded to the conductive plate 11*a* and a second bonding layer (an upper-side bonding layer) 2*f* that bonds the lower-side bonding layer 2*e* to the semiconductor chip 3.

The lower-side bonding layer 2*e* and the upper-side bonding layer 2*f* are each made from sintered material in a paste state or in a sheet-like state, as in the case of the bonding layer 2*a* in the semiconductor device according to the first embodiment. The lower-side bonding layer 2*e* and the upper-side bonding layer 2*f* may be either made from the same material or made from different materials. The lower-side bonding layer 2*e* may have the same thickness as the upper-side bonding layer 2*f*, or may have a thickness that is either thinner or greater than that of the upper-side bonding layer 2*f*.

The outer edge of the bonding interface 23 between the lower-side bonding layer 2*e* and the conductive plate 11*a* is located on the inside of the outer edge of the bonding interface 24 between the semiconductor chip 3 and the upper-side bonding layer 2*f*. The stress-concentrated portions P3 and P4 are thus provided at the positions at the outer edge of the bonding interface 23 between the lower-side bonding layer 2*e* and the conductive plate 11*a*. The other configurations of the semiconductor device according to the fourth embodiment are the same as those of the semiconductor device according to the first embodiment, and overlapping explanations are not repeated below.

The semiconductor device according to the fourth embodiment, which is configured to positively cause cracks starting from the stress-concentrated portions P3 and P4 of the lower-side bonding layer 2*e* of the bonding layer (2*e*, 2*f*) so as to be intentionally led to be damaged, as in the case of the configuration of the semiconductor device according to the first embodiment, can avoid a variation in the life span of the semiconductor device.

Figure 17:
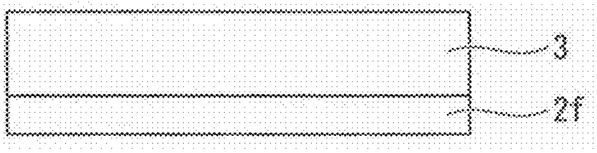
FIG. 17 is a schematic view illustrating a method of manufacturing the semiconductor device according to the fourth embodiment.

An example of a method of manufacturing the semiconductor device according to the fourth embodiment is described below with reference to FIG. 17 to FIG. 19. First, as illustrated in FIG. 17, the upper-side bonding layer 2*f* in a paste state is applied evenly to the bottom surface of the semiconductor chip 3 by screen printing or the like, and the upper-side bonding layer 2*f* is then dried. Alternatively, the upper-side bonding layer 2*f* may be formed evenly on the bottom surface of the semiconductor chip 3 by a transfer of a sintered sheet. The upper-side bonding layer 2*f* may be preliminarily formed on the bottom surface of a semiconductor wafer before diced into each piece of the semiconductor chips 3.

Figure 18:
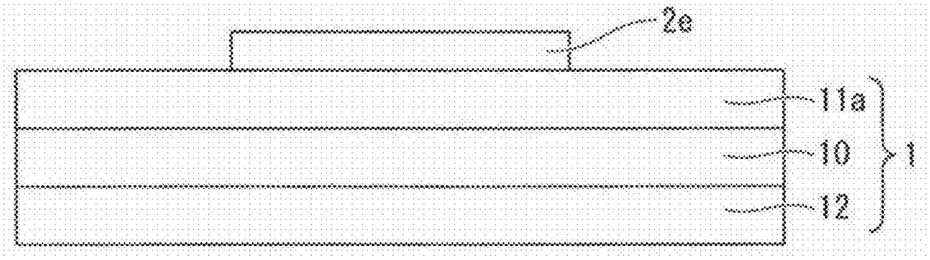
FIG. 18 is a schematic view continued from FIG. 17, illustrating the method of manufacturing the semiconductor device according to the fourth embodiment.

Further, as illustrated in FIG. 18, the lower-side bonding layer 2*e* in a paste state is applied to the top surface of the conductive plate 11*a* of the insulated circuit substrate 1 by screen printing or the like so as to have a smaller area than the upper-side bonding layer 2*f*, and the lower-side bonding layer 2*e* is then dried. Alternatively, the lower-side bonding layer 2*e* of a sintered sheet may be deposited on the top surface of the conductive plate 11*a* of the insulated circuit substrate 1.

Figure 19:
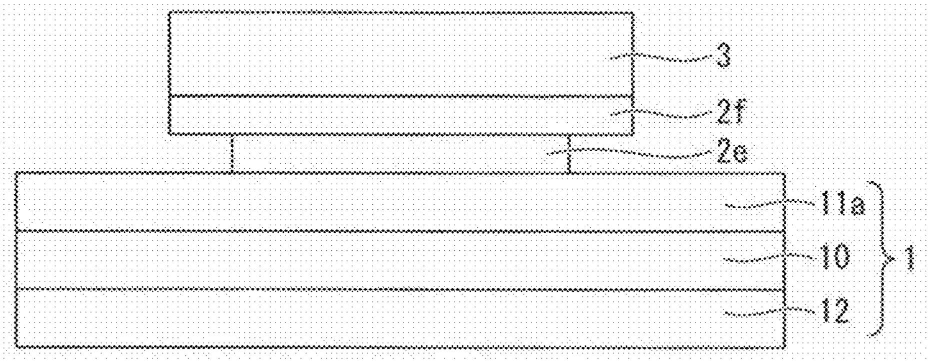
FIG. 19 is a schematic view continued from FIG. 18, illustrating the method of manufacturing the semiconductor device according to the fourth embodiment.

Next, as illustrated in FIG. 19, the upper-side bonding layer 2*f* provided on the bottom surface of the semiconductor chip 3 illustrated in FIG. 17 and the lower-side bonding layer 2*e* provided on the top surface of the insulated circuit substrate 1 are bonded together to be subjected to pressing and heating treatment so as to bond the insulated circuit substrate 1 and the semiconductor chip 3 together via the bonding layer (2*e*, 2*f*). The other steps of the method of manufacturing the semiconductor device according to the fourth embodiment are the same as those of the method of manufacturing the semiconductor device according to the first embodiment, and overlapping explanations are not repeated below.

While the semiconductor device according to the fourth embodiment is illustrated above with the configuration in which the bonding layer (2*e*, 2*f*) has the two-layer structure including the lower-side bonding layer 2*e* and the upper-side bonding layer 2*f*, the bonding layer may have a stacked structure including three or more layers made from sintered material. For example, when the bonding layer has a three-layer structure, a third bonding layer (an intermediate bonding layer) having a larger area than the lower-side bonding layer 2*e* and having a smaller area than the upper-side bonding layer 2*f* may be formed on the top surface of the lower-side bonding layer 2*e* after the lower-side bonding layer 2*e* is formed on the top surface of the conductive plate 11*a* of the insulated circuit substrate 1.

While the semiconductor device according to the fourth embodiment is illustrated above with the configuration in which the outer circumference of the upper-side bonding layer 2*f* conforms to the outer circumference of the semiconductor chip 3 and conforms to the outer edge of the bonding interface 24 between the semiconductor chip 3 and the upper-side bonding layer 2*f*, the outer circumference of the upper-side bonding layer 2*f* may be located on the inside of the outer circumference of the semiconductor chip 3 and conform to the outer edge of the bonding interface 24 between the semiconductor chip 3 and the upper-side bonding layer 2*f*. In addition, the semiconductor device according to the fourth embodiment is illustrated above with the case in which the outer circumference of the upper-side bonding layer 2*f* conforms to the outer circumference of the semiconductor chip 3, but the outer circumference of the upper-side bonding layer 2*f* may project to the outside from the outer circumference of the semiconductor chip 3.

Other Embodiments

As described above, the invention has been described according to the first to fourth embodiments, but it should not be understood that the description and drawings implementing a portion of this disclosure limit the invention. Various alternative embodiments of the present invention, examples, and operational techniques will be apparent to those skilled in the art from this disclosure.

The respective semiconductor devices according to the first to fourth embodiments have been illustrated above with the case in which the semiconductor chip 3 is bonded via the bonding wires 6*a*, 6*b*, and 6*c*, but are not limited to this case. For example, the present invention may also be applied to a semiconductor device in which an implanted substrate including a printed board to which pin-like post electrodes are inserted is provided over the semiconductor chip 3 connected to the post electrodes.

The configurations disclosed in the first to fourth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

The invention claimed is:

1. A semiconductor device comprising:

a conductive plate having a main surface;

a semiconductor chip deposited to be opposed to the main surface of the conductive plate; and a bonding layer including porous sintered material and arranged between the conductive plate and the semiconductor chip, wherein a first outer edge of a bonding interface between the bonding layer and the conductive plate is inside of an outer circumference of the semiconductor chip, and the first outer edge is inside of a second outer edge of a bonding interface between the bonding layer and the semiconductor chip by a distance of about 5 micrometers to about 50 micrometers.

2. The semiconductor device of claim 1, wherein an outer edge of the bonding layer toward the semiconductor chip projects outward from the outer circumference of the semiconductor chip.

3. The semiconductor device of claim 1, wherein an outer edge of the bonding layer toward the semiconductor chip conforms to the outer circumference of the semiconductor chip.

4. The semiconductor device of claim 1, wherein an outer edge of the bonding layer toward the semiconductor chip is located on an inside of the outer circumference of the semiconductor chip.

5. The semiconductor device of claim 1, wherein a surface of the bonding layer toward the conductive plate on an outside of the first outer edge is convex toward the conductive plate.

6. The semiconductor device of claim 1, wherein a stress-concentrated portion is provided in a part at the first outer edge.

7. The semiconductor device of claim 1, wherein a porosity in a part of the bonding layer inside of the first outer edge is higher than a porosity in a part of the bonding layer between an inside of the second outer edge and on an outside of the first outer edge.

8. The semiconductor device of claim 1, wherein the bonding layer includes a first bonding layer bonded to the conductive plate, and a second bonding layer provided to bond the first bonding layer and the semiconductor chip together.

9. The semiconductor device of claim 1, further comprising a sealing member provided to seal the semiconductor chip and the bonding layer, wherein the first outer edge has a point at which three of the bonding layer, the conductive plate, and the sealing member overlap with each other.

10. The semiconductor device of claim 1, wherein a thickness of the bonding layer is about 10 micrometers to about 50 micrometers.

11. The semiconductor device of claim 1, wherein a ratio of the distance to a diagonal length of the semiconductor chip in a plan view is about $1/2500$ to about $1/50$.

12. The semiconductor device of claim 1, wherein a ratio of the distance to a thickness of the bonding layer is about $1/1250$ to about $1/50$.

13. The semiconductor device of claim 2, wherein the distance is a first distance, and the outer edge of the bonding layer toward the semiconductor chip projects outward from the outer circumference of the semiconductor chip by a second distance of about 1 micrometer to about 30 micrometers.

14. A semiconductor device comprising:

a conductive plate having a main surface;

a semiconductor chip deposited to be opposed to the main surface of the conductive plate; and a bonding layer including porous sintered material and arranged between the conductive plate and the semiconductor chip, wherein a first outer edge of a bonding interface between the bonding layer and the conductive plate is inside of an outer circumference of the semiconductor chip and is inside of a second outer edge of a bonding interface between the bonding layer and the semiconductor chip, and an outer edge of the bonding layer on a side of the bonding layer that is closest to the semiconductor chip projects outward from the outer circumference of the semiconductor chip.

15. A semiconductor device comprising:

a conductive plate having a main surface;

a semiconductor chip deposited to be opposed to the main surface of the conductive plate; and a bonding layer including porous sintered material and arranged between the conductive plate and the semiconductor chip, wherein a first outer edge of a bonding interface between the bonding layer and the conductive plate is an inside of an outer circumference of the semiconductor chip and is inside of a second outer edge of a bonding interface between the bonding layer and the semiconductor chip, and a porosity in a part of the bonding layer inside of the first outer edge is higher than a porosity in a part of the bonding layer between an inside of the second outer edge and on an outside of the first outer edge.

* * * * *